(12) United States Patent
Arun Kumar et al.

(10) Patent No.: US 11,523,513 B2
(45) Date of Patent: Dec. 6, 2022

(54) PASSIVE COMPONENT ADAPTER FOR DOWNHOLE APPLICATION

(71) Applicant: Schlumberger Technology Corporation, Sugar Land, TX (US)

(72) Inventors: Swapna Arun Kumar, Sugar Land, TX (US); Srinand Karuppoor, Sugar Land, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 0 days.

(21) Appl. No.: 16/599,540

(22) Filed: Oct. 11, 2019

(65) Prior Publication Data

US 2021/0112663 A1   Apr. 15, 2021

(51) Int. Cl.
H05K 1/18 (2006.01)
H05K 1/11 (2006.01)
H05K 1/03 (2006.01)
H05K 3/40 (2006.01)
H05K 3/32 (2006.01)
E21B 41/00 (2006.01)
H05K 3/12 (2006.01)

(52) U.S. Cl.
CPC .............. *H05K 1/183* (2013.01); *E21B 41/00* (2013.01); *H05K 1/0306* (2013.01); *H05K 1/112* (2013.01); *H05K 3/12* (2013.01); *H05K 3/32* (2013.01); *H05K 3/4007* (2013.01); *H05K 3/4038* (2013.01); *H05K 2201/0175* (2013.01)

(58) Field of Classification Search
CPC ........ H05K 1/115; H05K 3/4038; H05K 3/02; H05K 3/10; H05K 3/0094; Y10T 29/49165; Y10T 29/49155; Y10T 29/49124; E21B 41/00
USPC .......................... 29/852, 846, 829, 847–851
See application file for complete search history.

(56) References Cited

U.S. PATENT DOCUMENTS

| 4,943,346 | A | * | 7/1990 | Mattelin | ................... C23F 1/02 |
| | | | | | 205/661 |
| 5,264,061 | A | * | 11/1993 | Juskey | ................. H05K 3/0023 |
| | | | | | 156/214 |
| 5,278,442 | A | * | 1/1994 | Prinz | ....................... B22F 3/115 |
| | | | | | 257/417 |

(Continued)

OTHER PUBLICATIONS

Tan et al., A review of printed passive electronic components through fully additive manufacturing methods, Virtual and Physical Prototyping, vol. 11, Issue 4, pp. 1-18, Aug. 2016.

(Continued)

*Primary Examiner* — Minh N Trinh

(57) ABSTRACT

An adapter board is described having a substrate having a width, a length and a depth and at least one electrical component placed one of within the substrate and on a surface of the substrate. The adapter board may also have a first pad positioned on the substrate, the first pad connected to the at least one electrical component through a first via. The adapter board may also have a second pad positioned on the substrate, the second pad connected to the at least one electrical component through a second via, wherein at least a portion of the adapter board is configured through an additive manufacturing process and wherein the substrate is configured to be installed within a downhole tool.

14 Claims, 4 Drawing Sheets

(56) References Cited

U.S. PATENT DOCUMENTS

| | | | |
|---|---|---|---|
| 6,515,233 B1* | 2/2003 | Labzentis | H05K 3/243 174/254 |
| 7,595,716 B2 | 9/2009 | Goto et al. | |
| 7,915,996 B2 | 3/2011 | Goto et al. | |
| 8,628,818 B1* | 1/2014 | Sharma | H05K 1/09 29/592 |
| 8,927,899 B2* | 1/2015 | Hofmann | H05K 3/465 219/121.69 |
| 8,943,682 B2* | 2/2015 | Cok | C23C 18/06 29/830 |
| 9,431,375 B2* | 8/2016 | Defretin | H01L 23/10 |
| 10,379,140 B2* | 8/2019 | Ekin | G01R 1/07357 |
| 10,839,992 B1 | 11/2020 | Klek et al. | |
| 2004/0083605 A1* | 5/2004 | Recktenwald | H05K 3/4602 29/830 |
| 2004/0255458 A1* | 12/2004 | Williams | H01L 24/12 29/846 |
| 2007/0172735 A1* | 7/2007 | Hall | H01M 2/021 429/233 |
| 2007/0279182 A1 | 12/2007 | Kodas et al. | |
| 2008/0135282 A1* | 6/2008 | Jonnalagadda | H05K 1/16 174/260 |
| 2010/0055941 A1* | 3/2010 | Dittmann | H05K 3/4092 439/77 |
| 2010/0109834 A1 | 5/2010 | Kosowsky et al. | |
| 2013/0153834 A1 | 6/2013 | Kumashiro et al. | |
| 2014/0123487 A1* | 5/2014 | Lee | H05K 1/0265 29/846 |
| 2016/0027562 A1 | 1/2016 | Feng et al. | |
| 2016/0126110 A1* | 5/2016 | Yang | H01L 21/561 438/125 |
| 2017/0189995 A1 | 7/2017 | Zenou et al. | |
| 2018/0017201 A1* | 1/2018 | Dupont | E21B 49/10 |
| 2018/0135408 A1* | 5/2018 | Cooley | E21B 47/13 |
| 2018/0326488 A1* | 11/2018 | Lappas | B23K 26/1462 |
| 2021/0112660 A1 | 4/2021 | Kumar et al. | |

OTHER PUBLICATIONS

Office Action issued in U.S. Appl. No. 16/599,554 dated Mar. 2, 2022, 29 pages.

* cited by examiner

PASSIVE COMPONENT ADAPTER FOR DOWNHOLE APPLICATION

CROSS REFERENCE TO RELATED APPLICATIONS

None.

STATEMENT REGARDING FEDERALLY SPONSORED RESEARCH OR DEVELOPMENT

None.

FIELD OF THE DISCLOSURE

Aspects of the disclosure relate to oil and gas drilling. More specifically, aspects of the disclosure relate to an adapter used in downhole components in the oil and gas drilling industry.

BACKGROUND INFORMATION

Passive electrical components manufacturing and delivery lead-times have been steadily increasing, and this increase can be attributed to growing demand from automotive and smart phone industries. Passive components, as defined, do not introduce net energy into the circuit or rely on a power source except for the circuit that the component is connected to. As a result, passive components do not amplify, or increase the power of a signal, but may be used to increase a voltage or current within a circuit.

Traditionally, passive components include different types of components. These components may be resistors, capacitors, inductors, and transformers. These components are directly incorporated into an electronics package by the oil and gas industry. Due to the longevity of service life of a downhole tool used in downhole operations, the industry has recently encountered difficulty in obtaining electrical parts to fit the legacy apparatus used. In general, as time has elapsed, electrical component manufacturers tend to manufacture smaller electrical components. These smaller resistors, capacitors and other components will not fit into the legacy apparatus as the footprint of the new components is substantially reduced compared to the previous design sizes.

Apparatus used in downhole operations of the oil and gas industry require a certain level of uniformity and continuity, therefore, operators of downhole equipment make very few purchases of passive components. Once these passive components are used, there is no stockpile upon which to receive further components. This causes a significant issue with maintenance of legacy ("older") components. Without spare parts being generated for these legacy tools, many of the tools are required to be retired prior to their service life being spent.

Recent developments in the technology in other industries, such as automotive and aerospace, have resulted in manufactures receiving demands for smaller size passive components to be use. In order to supply the demand, several manufacturers of passive components are moving away from the larger size parts in order to secure the capacity for smaller case sizes. Compounding the problem, designers for electronics today merely use "standard form" electronic components when possible to drive down the cost of a designed product. This, in turn, prevents the use of older types of components which again impacts availability.

There is a need for an adapter board that has the capability to use the smaller size passive components that are currently available, to fit into legacy apparatus of downhole systems, while maintaining the functionality of the downhole equipment.

There is a further need for an adapter board that will accept multiple types of smaller size passive components to circumvent the need to use obsolete larger size passive components.

There is a further need for an adapter board that can be assembled in the footprint of the existing larger size passive components without compromising performance and reliability.

There is a still further need to provide for electrical components that may be used in legacy devices without significant cost expense for manufacturers.

SUMMARY

So that the manner in which the above recited features of the present disclosure can be understood in detail, a more particular description of the disclosure, briefly summarized below, may be had by reference to embodiments, some of which are illustrated in the drawings. It is to be noted that the drawings illustrate only typical embodiments of this disclosure and are therefore not to be considered limiting of its scope, for the disclosure may admit to other equally effective embodiments without specific recitation. Accordingly, the following summary provides just a few aspects of the description and should not be used to limit the described embodiments to a single concept.

In one example embodiment, an adapter board is disclosed. The adapter board is configured with a substrate having a width, a length and a depth. The adapter board is further configured with at least one electrical component placed one of within the substrate and on a surface of the substrate. The adapter board is further configured with a first pad positioned on the substrate, the first pad connected to the at least one electrical component through a first via. The adapter board is further configured with a second pad positioned on the substrate, the second pad connected to the at least one electrical component through a second via, wherein at least a portion of the adapter board is configured through an additive manufacturing process and wherein the substrate is configured to be installed within a downhole tool.

In one non-limiting embodiment, a method to prepare an adapter board for a downhole tool is disclosed. The method may comprise providing a substrate and creating at least two terminal pads on the substrate through a three-dimensional printing process. The method may also provide for creating a pattern one of on and in the substrate through a three-dimensional printing process, wherein the pattern has at least two ends, wherein the pattern includes at least one electrical component. The method may also provide for connecting at least a first of the at least two terminal pads on the substrate to a first of the pattern ends and connecting at least a second of the at least two terminal pads on the substrate to a second of the pattern ends.

In another embodiment, a method for preparing an adapter board for a downhole tool, is disclosed comprising starting a first three-dimensional printing process of a substrate, wherein the substrate has a substrate area that has a first non-conductive substrate area and a second conductive substrate area, wherein the second conductive area produces a first via area, a second via area and an electrical component cavity connecting both the first via area and the second via area. The method may further be performed including installing at least one electrical component in the electrical component cavity. The method may also be performed to include starting a second three-dimensional printing the substrate in at least one of the first non-conductive substrate area and the second conductive substrate area.

Other aspects and advantages will become apparent from the following description and the attached claims.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the drawings. It is to be noted, however, that the appended drawings illustrate only typical embodiments of this disclosure and are therefore not be considered limiting of its scope, for the disclosure may admit to other equally effective embodiments.

Figure 1:
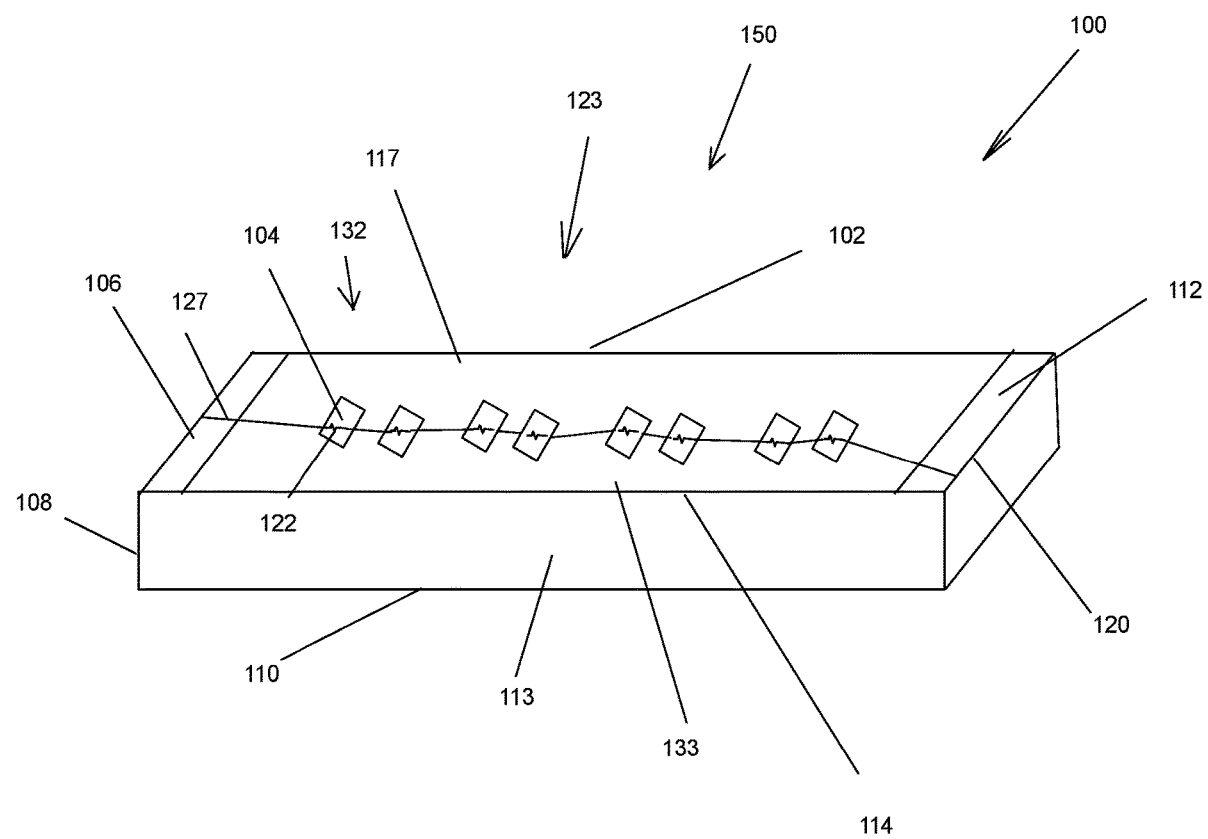
FIG. 1 is a side perspective view of a 5025 mm size adapter board with cavities for mounting electrical components.

To facilitate understanding, identical reference numerals have been used, where possible, to designate identical elements that are common to the figures ("FIGS"). It is contemplated that elements disclosed in one embodiment may be beneficially utilized on other embodiments without specific recitation.

DETAILED DESCRIPTION

In the following, reference is made to embodiments of the disclosure. It should be understood, however, that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the claims except where explicitly recited in a claim. Likewise, reference to "the disclosure" shall not be construed as a generalization of inventive subject matter disclosed herein and shall not be considered to be an element or limitation of the claims except where explicitly recited in a claim.

Some embodiments will now be described with reference to the figures. Like elements in the various figures will be referenced with like numbers for consistency. In the following description, numerous details are set forth to provide an understanding of various embodiments and/or features. It will be understood, however, by those skilled in the art that some embodiments may be practiced without many of these details and that numerous variations or modifications from the described embodiments are possible. As used herein, the terms "above" and "below", "up" and "down", "upper" and "lower", "upwardly" and "downwardly", and other like terms indicating relative positions above or below a given point are used in this description to more clearly describe certain embodiments.

Aspects of the disclosure relate to the development of an adapter board for electrical components. More specifically, aspects of the disclosure relate to an adapter board that is configured with a footprint of a specified size. The footprint of the adapter board may have different size footprints to allow for adaptation of the board to be placed in legacy designs for downhole components. The circuitry placed on the adapter board is designed to provide a specific function necessary in downhole operations involved in the recovery of hydrocarbons from strata.

Aspects of the disclosure provide for production of the adapter board through an additive manufacturing process, commonly known as three-dimensional ("3D") printing. Several suppliers for electronics have made business decisions the cease production of certain types of products. These types of products that are not going to manufactured are more specialized components that do not have a dual use capability with the oil field market, for example, in the automotive field. As these products are only used in oil field operations, manufacturing and capacity have been redirected to smaller, more economical case sizes, looking for economical returns.

In the aspects disclosed, three-dimensional printing and modeling are discussed. Applicable types of three-dimensional printing may be, as non-limiting embodiments, fused deposition modeling, stereolithography, digital light processing, selective laser sintering, material jetting, drop on demand, sand binder jetting, metal binder jetting, direct metal laser sintering/selective laser melting and electron beam melting. These processes may be used to create circuitry to perform various functions. When forming a substrate for electronics, as a non-limiting embodiment, a crystalized silicon may be used as a material in the formation of non-conductive portions of circuits, with a conductive material being used in portions or areas where electrons will flow. The conductive materials may be copper, aluminum, silver, gold or other metallic elements or compounds.

In the instance of passive components, small chip package sizes are being manufactured, while larger chip package sizes are being abandoned. In the industry, for example, chip package sizes 0402 mm are being maintained, while larger chip sizes, such as 3216 mm and above, are abandoned. Manufacturing lines are now made such that multiple smaller chip packages may be manufactured, rather than a single larger chip size. As a matter of example, manufacturers may efficiently produce 80 pieces of 0402 mm size parts instead of a single 3216 mm size. For manufacturers, greater profits may be made off of the production of 80 pieces rather than a single piece. Manufacturing of the larger size components, therefore, is quickly being abandoned as the manufacturing of these components is not economical.

In the recovery of hydrocarbons, downhole tools use robust electronics due to the effects of temperature, pressure and shock. The larger size chip packages originally designed for the downhole tools are qualified to perform these functions without issue. The smaller size chip packages, however, cannot be used in an interchangeable manner.

As larger size chips are less common or not available, it is necessary to provide a replacement for the components that are not available. Aspects of the disclosure relate to providing an adapter board with a footprint that fits the legacy size of the electronics of original designs, for example 5025 mm. These aspects, however, allow the use of more modern electronics made in smaller sizes, to alleviate the need to use outdated components. Referring to FIG. 1, a substrate 102 is illustrated. The substrate 102 is configured to be placed within an electrical package of a downhole tool apparatus used in the recovery of hydrocarbons from geological stratum. As the electrical package and the incorporated substrate 102 will be used in a downhole environment, harsh conditions may be placed upon the substrate 102. In one embodiment, the substrate 102 may be exposed to 20,000 pounds per square inch pressure. In other embodiments, the substrate 102 may be exposed to temperatures exceeding 200° C. In other embodiments, the substrate 102 may be exposed to shock values exceeding 9 (g) wherein g is defined by the acceleration of gravity. The substrate 101 may be configured with conductive areas 170 that include electrical components 122 and wrap-around terminations or pads 106A and 106B as well as vias 143. Other areas of the substrate 101 may not be conductive as no metallic or electrically conductive materials are used.

In FIG. 1, an adapter board 100 is illustrated. The adapter board 100 is configured with a substrate 102 that has a width 120, a length 110 and a depth 108. The adapter board 100, therefore, has a surface 180 upon which the electrical connections may be made. The substrate 102 may have cavity portions 104 that are provided in the substrate 102. The cavity portions 104 may house electrical components 122 that are placed within the substrate 102. The substrate 102 is configured with a wrap-around termination or pad 106A on a first side 140 of the substrate 102. In other embodiments, a second termination pad 106B may be located on a second side 142 of the substrate 102. The first side 140 of the substrate 102 may be directly opposite the second side 142 of the substrate 102. In this configuration, the termination or pad 106A, 106B may be used to provide a needed electrical connection between other components of the downhole tool and the substrate 102. In the illustrated embodiment, eight electrical components 122 are illustrated as present within the substrate 102. Such a configuration should be considered merely illustrative as more or less numbers of electrical components 122 may be used. In this illustrated embodiment, the surface mounted pads 106 may be connected through vias 143. The electrical components 122 together with the vias 143 form a pattern 130. The pattern 130 may have ends 132 that end on termination pad 106A and second termination pad 106B.

The adapter board 100 disclosed above may be used within an electronics package used in a downhole tool. The types of downhole tools may include drilling tools, measurement tools, resistivity tools, nuclear magnetic resonance ("NMR") tools, and completion tools as non-limiting embodiments. As will be understood, the adapter board 100 may be specified to fit an expected footprint within the designated tool. In the final design of the adapter board 100, therefore, contacts, called "termination pads" or simply "pads" may be used to provide the electrical connection points to the adapter board 100. The connection to the "pads" may be through soldering to provide the required electrical connection. The soldering to the "pads" may be designed to withstand the same environmental conditions that are required for survival as the downhole tool.

In the illustrated embodiment of FIG. 1, electrical connection design is simplified to two (2) connections. As will be understood, however, multiple connections may be present on the adapter board 100. Materials used in the design of the adapter board 100 may be doped and/or ion implanted to help with conduction or resistance to electrical flow. Packaging of the adapter board 100 may be as a board design, as shown, or manufacturing may continue directly soldering connections to the board 100.

As will be understood, cavity portions 104 are configured to allow connection of electrical components, such as resistors, to traces that are formed for electrical flow. In embodiments, the cavity portions 104 are left voided. In other embodiments, a second three-dimensional printing process may be performed filling the cavity portions 104, thereby embedding the electrical components 122 placed within the original void.

Connection of the electrical components 122 to the other conductive areas of the adapter board 100 may be performed through various functions. Solder may be used, similar to ball grid array manufacturing, to surface mount affix the electrical component 122. In embodiments, the three-dimensional printing may specifically place materials on connection points or solder pads for the electrical component to abut. Placement of the electrical component 122 on to the pad may then take place. The adapter board 100 may then be placed in an oven to heat the substrate, the traces and the solder pads to a point where the electrical component 122 is soldered to the adapter board 100. The resulting adapter board 100 may then be cooled to prevent cracking of the new solder joints. If necessary, a second three-dimensional printing process may then be conducted such that further layers of electrical components may be placed, as needed. As will be understood, several layers of electrical components may be established by the three-dimensional printing process with multiple soldering pads formed. In such embodiments, a single oven treatment may be used to establish solder connections in one step.

In the illustrate embodiment, the substrate 102 is provided with a first end 108, a second end 112. Each of the first end 108 and the second end 112 are provided with a terminal end 106, 112, respectively. The substrate 102 is also provided with a top face 117 and a bottom face 110 as well as a front face 113 and a rear face 123. Vias 127 may connect the electrical components 122, therefore providing a conductive region or area 132. Areas that are not connected by vias 122 may be non-conductive regions 133. A pattern 150 may be created by the conductive regions or areas 132 placed upon the substrate 102.

Figure 2:
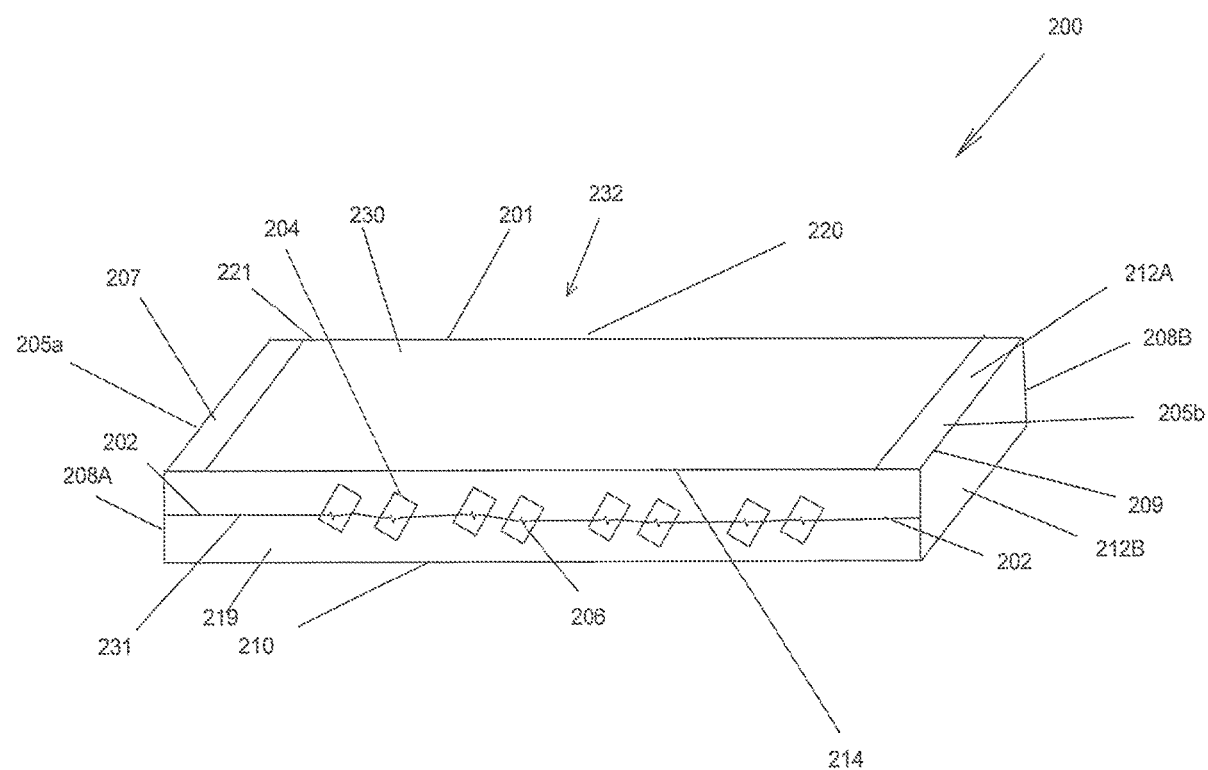
FIG. 2 is a side perspective view of a 5025 mm size adapter board with cavities for mounting electrical components, wherein the electrical components are submerged from a top surface of the substrate.

Referring to FIG. 2, an adapter board 200 is illustrated. The adapter board 200 is configured with a length 211, a depth 212A and a width 213. The footprint of the adapter board 200, the length 211 multiplied by the width 213 may be altered to allow for larger overall configurations or smaller configurations. In the illustrated embodiment, the substrate 201 has a first end 208A, a bottom face 210, a top face 230, a second end 212B, a front face 219 and a back face 221.

The adapter board 200 is configured from vias 202 are placed between the cavity portions 204 connecting electrical components 206 submerged within the adapter board 200. The vias 202 may be configured with a metallic substance such that conduction of electricity is performed through the vias 202 and the electrical components 206 placed within the cavity portions 204. In one embodiment, the metallic substance may be copper or a copper alloy. In other embodiments, the metallic substance may be made of a gold or a gold alloy. In the illustrated embodiment, the cavity portions 204 are rectangular shaped. In another embodiment, the cavity portions 204 may be circular shaped. The width of the vias 202 may be altered according to the size of the electrical components 206 placed within the cavity portions 204.

Further referring to FIG. 2, the substrate 201 used for the adapter board 200 is configured with a wrap-around termination or pad 205A, 205B on either the side 207, 209 of the substrate 201 on an exterior face of the substrate 201. In this configuration, a termination or pad 205A, 205B may be provided on each side 207, 209 of the substrate 201 to provide a needed electrical connection between other components of the downhole tool and the substrate 201. In the illustrated embodiment, eight electrical components 206 are illustrated as present within the substrate 201. Such a configuration should be considered merely illustrative as more or less numbers of electrical components may be used. In the illustrated embodiment of FIG. 2, the electrical components 206 may be fully submerged within the substrate 201. In another example embodiment, the electrical components 206 may extend out a back of the substrate 201.

In the manufacturing of the adapter board 200, the placement of the electrical components 206 may be performed while the remainder of the substrate 201 is being accomplished. In this matter, for example, the electrical components 206 may be constructed within the substrate 201 at any desired depth. As the size of the electrical components 206 are small, the overall thickness 208B of the substrate 201 may be thin, allowing the substrate 201 to be incorporated into various electrical packages.

In the illustrated embodiment, the adapter board 200 has non-conductive areas 230 and conductive areas 231 that include a pattern 232 having electrical components 206, and vias 202.

Figure 3:
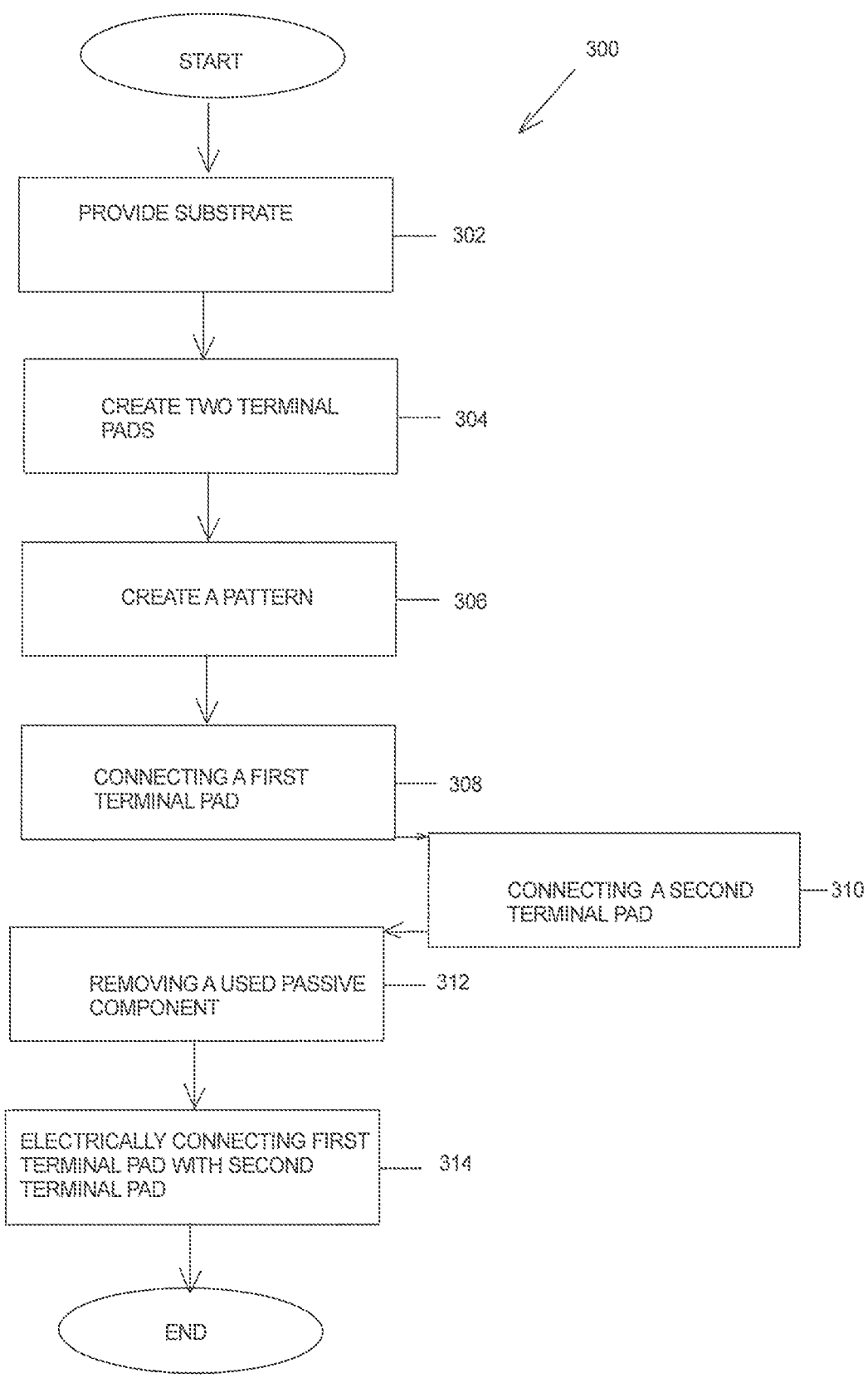
FIG. 3 is a method of production of an adapter board used in downhole applications with submerged internal components.
Figure 4:
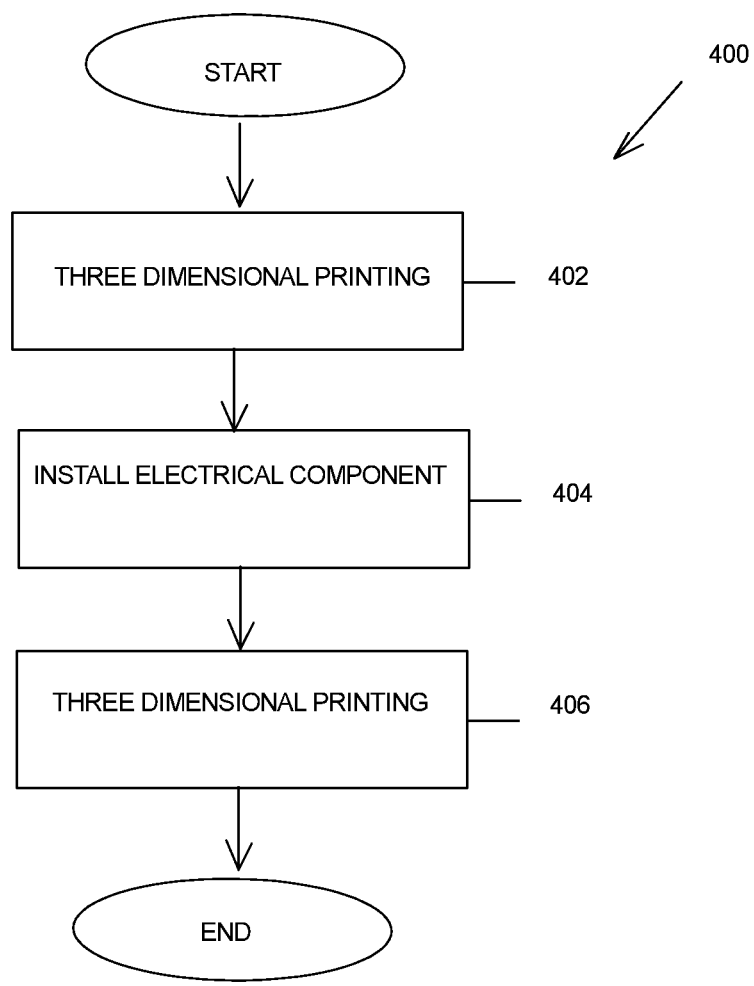
FIG. 4 is a second method of production of an adapter board used in downhole applications.

Referring to FIG. 3, a method 300 to prepare an adapter board for a downhole tool is disclosed. The method 300 may include, at 302, providing a substrate. At 304, the method continues by creating at least two terminal pads on the substrate through a three dimensional printing process. At 306, the method continues by creating a pattern one of on and in the substrate through a three-dimensional printing process, wherein the pattern has at least two ends, wherein the pattern includes at least one electrical component. At 308, the method continues by connecting at least a first of the at least two terminal pads on the substrate to a first of the pattern ends. At 310, the method continues by connecting at least a second of the at least two terminal pads on the substrate to a second of the pattern ends. At 312, the method continues by removing a used passive component of the electrical package. At 314, the method continues by electrically connecting the first terminal pad and the second terminal pad to the electrical package of the downhole tool, wherein the adapter board replaces the used passive component wherein the three-dimensional printing process is one of selective laser sintering, metal binder jetting, electron beam melting, fused deposition modeling Referring to FIG. 4, a second method 400 for preparing an adapter board for a downhole tool is disclosed. In this second method 400, a three-dimensional printing of a substrate is started, at 402 wherein the three-dimensional printing produces a first non-conductive substrate area and a second conductive substrate area, wherein the second conductive area produces a first via area, a second via area and an electrical component cavity, the electrical component cavity connecting both the first via area and the second via area. At 404, the method continues wherein at least one electrical component is installed in the electrical component cavity. At 406, the method continues by three-dimensional printing the substrate in at least one of the first non-conductive substrate area and the second conductive substrate area. In this embodiment, a first end and a second end produced for the substrate from the three-dimensional printing may include conductive areas such that the substrate may be placed into an electronics package in a downhole tool. In such a method, the at least one electrical component used provides a smaller footprint than the overall footprint of the substrate area, thereby allowing smaller electrical components to be used in a larger footprint size. As will be understood, multiple installation steps and three dimensional printing steps may be interchanged to produce the final product.

In one example embodiment, an adapter board is disclosed. The adapter board is configured with a substrate having a width, a length and a depth. The adapter board is further configured with at least one electrical component placed one of within the substrate and on a surface of the substrate. The adapter board is further configured with a first pad positioned on the substrate, the first pad connected to the at least one electrical component through a first via. The adapter board is further configured with a second pad positioned on the substrate, the second pad connected to the at least one electrical component through a second via, wherein at least a portion of the adapter board is configured through an additive manufacturing process and wherein the substrate is configured to be installed within a downhole tool.

In another example embodiment, the adapter board may be configured wherein the substrate is configured from an aluminum ceramic material.

In another example embodiment, the adapter board may be configured wherein the first pad is located on a first side of the substrate.

In another example embodiment, the adapter board may be configured wherein the second pad is located on a second side of the substrate.

In another example embodiment, the adapter board may be configured wherein the additive manufacturing process is a three-dimensional printing process.

In another example embodiment, the adapter board may be configured wherein the at least one electrical component is mounted one of on and within the substrate.

In another example embodiment, the adapter board may be configured wherein the mounting of the at least one electrical component is through a placement of the at least one electrical component within a cavity of the substrate.

In one non-limiting embodiment, a method to prepare an adapter board for a downhole tool is disclosed. The method may comprise providing a substrate and creating at least two terminal pads on the substrate through a three-dimensional printing process. The method may also provide for creating a pattern one of on and in the substrate through a three-dimensional printing process, wherein the pattern has at least two ends, wherein the pattern includes at least one electrical component. The method may also provide for connecting at least a first of the at least two terminal pads on the substrate to a first of the pattern ends and connecting at least a second of the at least two terminal pads on the substrate to a second of the pattern ends.

In another non-limiting embodiment, the method may be performed wherein the first terminal pad is on at least a side face of the substrate.

In another non-limiting embodiment, the method may be performed wherein the second terminal pad is on at least a second side face of the substrate.

In another non-limiting embodiment, the method may be performed wherein the first terminal pad is on at least a first side face of the substrate and the second terminal pad is on a second side face of the substrate and wherein the first side face of the substrate is on an opposite side of the second side face of the substrate.

In another non-limiting embodiment, the method may be performed wherein the adapter board is configured to accept an electrical signal, process the electrical signal and output an electrical signal to the downhole tool.

In another non-limiting embodiment, the method may be performed wherein the creating the pattern one of on and in the substrate through the three-dimensional printing process includes placing an electrical component within the pattern.

In another non-limiting embodiment, the method may be performed wherein the placing the electrical component within the pattern includes using a smaller die size electrical component than a dies size of the substrate.

In another non-limiting embodiment, the method may be performed wherein the connecting of the first of the at least two terminal pads to the first of the pattern ends is through a first three-dimensional via and the connecting of the second of the at least two terminal pads to the second of the pattern ends is through a second three-dimensional via.

In another non-limiting embodiment, the method may be performed wherein the first three-dimensional via is made through a three-dimensional printing.

In another non-limiting embodiment, the method may be performed wherein the second three-dimensional via is made through a three-dimensional printing.

In another embodiment, a method for preparing an adapter board for a downhole tool, is disclosed comprising starting a first three-dimensional printing process of a substrate, wherein the substrate has a substrate area that has a first non-conductive substrate area and a second conductive substrate area, wherein the second conductive area produces a first via area, a second via area and an electrical component cavity connecting both the first via area and the second via area. The method may further be performed including installing at least one electrical component in the electrical component cavity. The method may also be performed to include starting a second three-dimensional printing the substrate in at least one of the first non-conductive substrate area and the second conductive substrate area.

In another embodiment, the method may be performed wherein at least one of the first three-dimensional printing process and the second three-dimensional printing process creates at least a first termination pad and a second termination pad.

In another embodiment, the method may be performed wherein the second conductive area is configured from at least one metallic component.

While embodiments have been described herein, those skilled in the art, having benefit of this disclosure, will appreciate that other embodiments are envisioned that do not depart from the inventive scope. Accordingly, the scope of the present claims or any subsequent claims shall not be unduly limited by the description of the embodiments described herein.

What is claimed is:

1. A method forming and installing of an adapter board to replace a passive component on a downhole tool, said the downhole tool having an electrical package with a u passive component, the method, comprising:

forming the adapter board by providing a substrate;
   creating at least two terminal pads on the substrate through a three-dimensional printing process;
   creating a pattern on the substrate through the three-dimensional printing process; wherein the pattern formed has at least two ends, and said pattern formed further comprises connection adapted for mounting the used passive electrical component;
   connecting a first terminal pad of the at least two terminal pads on the substrate to one of the two ends of the pattern formed;
   connecting a second terminal pad of the at least two terminal pads on the substrate to another one of the two ends of the pattern formed as so to form the adapter board;
   removing the used passive component from the electrical package of the downhole tool; and
   installing the adapter board after removing the used passive component from the electrical package of the downhole tool by connecting the adapter board to the electrical package of the downhole tool to replace the used passive component by electrically connecting the first terminal pad and the second terminal pad of the adapter board to the electrical package of the downhole tool by the three-dimensional printing process, wherein the three-dimensional printing process is selective from one of metal binder jetting, electron beam melting, and fused deposition modeling.

2. The method according to claim 1, wherein the first terminal pad is on at least a side face of the substrate.

3. The method according to claim 1, wherein the second terminal pad is on at least a second side face of the substrate.

4. The method according to claim 1, wherein the first terminal pad is on at least a first side face of the substrate and the second terminal pad is on a second side face of the substrate and wherein the first side face of the substrate is on an opposite side of the second side face of the substrate.

5. The method according to claim 1 wherein the adapter board accepts an electrical signal, processes the electrical signal and outputs an electrical signal to the downhole tool.

6. The method according to claim 1, wherein creating the pattern on the substrate through the three-dimensional printing process includes placing endpoints of an electrical component position within the pattern.

7. The method according to claim 6, wherein placing the endpoints of an electrical component within the pattern includes using a smaller die size electrical component than a die size of the substrate.

8. The method according to claim 6 wherein connecting the first terminal pad to the first of the pattern ends is through a first three-dimensional via and connecting the second terminal pad to the second of the pattern ends is through a second three-dimensional via.

9. The method according to claim 8, wherein the first three-dimensional via is made through three-dimensional printing.

10. The method according to claim 8, wherein the second three-dimensional via is made through three-dimensional printing.

11. The method according to claim 1, wherein the adapter board functions in environmental conditions that include pressure, temperature and shock valves.

12. The method according to claim 11, wherein the adapter board functions in environmental conditions that include the pressure is up to 20,000 pounds per square inch.

13. The method according to claim 11, wherein the adapter board functions in environmental conditions that include the temperature exceeding 200° C.

14. The method according to claim 11, wherein the adapter board functions in environmental conditions that include the shock valves exceeding 9 g.

* * * * *